(12) United States Patent
Pahl et al.

(10) Patent No.: US 9,331,010 B2
(45) Date of Patent: May 3, 2016

(54) SYSTEM SUPPORT FOR ELECTRONIC COMPONENTS AND METHOD FOR PRODUCTION THEREOF

(75) Inventors: Wolfgang Pahl, Munich (DE); Karl Weidner, Munich (DE)

(73) Assignee: Epcos AG, Munich (DE)

( * ) Notice: Subject to any disclaimer, the term of this patent is extended or adjusted under 35 U.S.C. 154(b) by 496 days.

(21) Appl. No.: 12/996,738

(22) PCT Filed: Jun. 3, 2009

(86) PCT No.: PCT/EP2009/056832
§ 371 (c)(1),
(2), (4) Date: Feb. 22, 2011

(87) PCT Pub. No.: WO2009/150087
PCT Pub. Date: Dec. 17, 2009

(65) Prior Publication Data
US 2011/0133315 A1   Jun. 9, 2011

(30) Foreign Application Priority Data
Jun. 13, 2008   (DE) .......................... 10 2008 028 299

(51) Int. Cl.
*H01L 23/495*   (2006.01)
*H01L 23/498*   (2006.01)
(Continued)

(52) U.S. Cl.
CPC .......... *H01L 23/4985* (2013.01); *B81B 7/0048* (2013.01); *H01L 24/24* (2013.01); *H01L 24/82* (2013.01); *B81B 2207/07* (2013.01); *H01L 23/498* (2013.01); *H01L 23/5387* (2013.01); *H01L 24/80* (2013.01); *H01L 2224/24051* (2013.01); *H01L 2224/24226* (2013.01); *H01L 2224/24998* (2013.01);
(Continued)

(58) Field of Classification Search
CPC . H01L 23/498; H01L 23/4985; H01L 2/5387; H01L 24/80; H01L 24/82
USPC ................ 257/668, 669, 676, 687–689, 723, 257/725–727, E23.04, E23.06, E23.177, 257/E23.178
See application file for complete search history.

(56) References Cited

U.S. PATENT DOCUMENTS 4,887,147 A * 12/1989 Friedman ....................... 174/252
5,552,637 A *  9/1996 Yamagata ............. H01L 23/147
                                                              257/717

(Continued)

FOREIGN PATENT DOCUMENTS

DE      202005001559 A1    5/2005
DE         29823791 U1     8/2005
(Continued)

OTHER PUBLICATIONS

Written Opinion corresponding to International Patent Application No. PCT/EP2009/056832, European Patent Office, dated Feb. 5, 2010, 7 pages.
(Continued)

*Primary Examiner* — Matthew E Warren
(74) *Attorney, Agent, or Firm* — Nixon Peabody LLP

(57) ABSTRACT

A chip (2, 3) is arranged above a top side of a flexible support (1) and mechanically decoupled from the support. Electrical connections (8, 11) of the chip are embodied using a planar connection technique. The chip can be separated from the support by an air gap or a base layer (7) composed of a soft or compressible material.

21 Claims, 4 Drawing Sheets

(51) Int. Cl.
*B81B 7/00* (2006.01)
*H01L 23/00* (2006.01)
*H01L 23/538* (2006.01)

(52) U.S. Cl.
CPC ............... *H01L 2224/76155* (2013.01); *H01L 2224/82007* (2013.01); *H01L 2224/82102* (2013.01); *H01L 2924/014* (2013.01); *H01L 2924/01005* (2013.01); *H01L 2924/01013* (2013.01); *H01L 2924/01029* (2013.01); *H01L 2924/01033* (2013.01); *H01L 2924/01068* (2013.01); *H01L 2924/01082* (2013.01); *H01L 2924/09701* (2013.01); *H01L 2924/14* (2013.01); *H01L 2924/1433* (2013.01); *H01L 2924/1461* (2013.01); *H01L 2924/181* (2013.01); *H01L 2924/3025* (2013.01)

(56) References Cited

U.S. PATENT DOCUMENTS

| | | | |
|---|---|---|---|
| 6,780,747 B2 * | 8/2004 | Distefano | H01L 21/561 257/E21.504 |
| 7,145,283 B2 | 12/2006 | Takeuchi et al. | |
| 7,402,457 B2 | 7/2008 | Hase et al. | |
| 7,671,382 B2 * | 3/2010 | Sudo | H01L 23/3121 257/181 |
| 7,807,931 B2 | 10/2010 | Auerbach et al. | |
| 2005/0103105 A1 * | 5/2005 | Emmerich | B81B 7/0048 73/493 |
| 2005/0189635 A1 | 9/2005 | Humpston et al. | |
| 2006/0138638 A1 * | 6/2006 | Komatsu | H01L 21/486 257/700 |
| 2007/0082531 A1 | 4/2007 | Higuchi | |
| 2007/0190290 A1 | 8/2007 | Gunther et al. | |
| 2008/0001244 A1 | 1/2008 | Schwarzbauer | |
| 2008/0098819 A1 * | 5/2008 | Murata | G01L 19/0627 73/708 |
| 2008/0164616 A1 | 7/2008 | Kasper et al. | |
| 2008/0191360 A1 | 8/2008 | Weidner et al. | |
| 2009/0127697 A1 | 5/2009 | Pahl | |
| 2009/0260226 A1 | 10/2009 | Tinguely et al. | |
| 2009/0261691 A1 | 10/2009 | Maeda | |

FOREIGN PATENT DOCUMENTS

| | | |
|---|---|---|
| DE | 102004015597 A1 | 11/2005 |
| DE | 102005050398 A1 | 4/2007 |
| DE | 1837303 A1 | 9/2007 |
| DE | 102007010711 A1 | 9/2008 |
| EP | 0187303 A2 | 7/1986 |
| JP | 02-172246 A | 7/1990 |
| JP | 03-268339 A | 11/1991 |
| JP | 04-095740 A | 3/1992 |
| JP | 05-340962 A | 12/1993 |
| JP | 10-135614 | 10/1996 |
| JP | 09-097870 A | 4/1997 |
| JP | 10-062444 A | 3/1998 |
| JP | 11-211749 A | 8/1999 |
| JP | 2000-304764 A | 11/2000 |
| JP | 01-324333 A | 11/2001 |
| JP | 2002-098709 A | 4/2002 |
| JP | 05-243930 A | 9/2005 |
| JP | 2005-322878 A | 11/2005 |
| JP | 2006-078248 A | 3/2006 |
| JP | 2006-329840 A | 12/2006 |
| JP | 07-047023 A | 2/2007 |
| JP | 07-107953 A | 4/2007 |
| JP | 2008-053350 A | 3/2008 |
| JP | 2008-091587 A | 4/2008 |
| WO | 99/18609 A1 | 4/1999 |
| WO | WO 2005/122657 A1 | 12/2005 |

OTHER PUBLICATIONS

International Search Report corresponding to International Patent Application No. PCT/EP2009/056832, European Patent Office, dated Feb. 5, 2010, 4 pages.

* cited by examiner

SYSTEM SUPPORT FOR ELECTRONIC COMPONENTS AND METHOD FOR PRODUCTION THEREOF

The present invention relates to a system support for an electronic component, such as an MEMS component, for example, which protects the component against transmission of mechanical stresses, and an associated production method.

Many microelectronic components are sensitive to mechanical strains of the chip, which can result for example from absorption of moisture or thermal expansion of the housing and mounting materials used or else from flexure or vibration of the printed circuit board onto which the chip is mounted. A housing provided for the chip has to afford sufficient protection, but at the same time keep the mechanical stress of the chip as small as possible. In particular, the contact-connection of the component must not be jeopardized.

In the case of the conventional mounting of semiconductor chips, the chip is mounted onto a rigid support, for example a housing base or a leadframe, by means of adhesive or metallic contact elements, such as solder, for example, and encapsulated at a plurality of sides with plastic, usually thermosetting plastic. The relatively hard plastics used for this purpose transmit mechanical stresses to the chip and in addition absorb water, which likewise leads to deformations and mechanical stresses of the chip.

When relatively large, hermetically sealed metal or ceramic housings are used, the chip is mounted in a cavity of the housing and connected by means of bonding wires. In order to protect the long bonding wires required for this purpose and to prevent short circuits, the cavity is filled with very soft silicone gel. However, the high coefficient of thermal expansion of such materials entails, for its part, reliability risks.

In the technique of tape automated bonding (TAB), a thin, flexible, electrically insulating film tape is stamped in order to form guide grids and windows for chip mounting, and is then coated with a thin layer of copper, which is phototechnologically patterned to form contacts and connecting structures. The chip is connected by soldering or bonding to copper lugs projecting freely into the mounting windows. After stamping-out from the film tape, the component can be connected to a printed circuit board by means of external contact lugs by soldering or connection by means of electrically conductive adhesive. In order to protect the chip, a molding compound in the form of a so-called glob top is usually applied, but again relatively high mechanical forces are thereby transmitted to the chip.

U.S. Pat. No. 7,145,283 B2 describes a chip having a piezoelectric component, which is mounted by means of a TAB method. A protective housing having a cavity in which the chip is arranged is provided.

WO 2007/045 204 A1 describes a method wherein a stress-reducing connecting structure is produced phototechnologically for the mounting of the chip in a housing, a conventional housing being used.

In the method of freescale redistributed chip packaging (freescale RCP), the chips are adhesively bonded by the connection side onto a support film and then embedded into a plastics compound on the rear side by molding or potting. As a result of the adhesive bonding on the front side, the connection planes of individual chips are brought to a common wiring plane in a flush fashion. That requires the rear-side embedding for fixing the chips. Even with the use of materials having coefficients of thermal expansion adapted to the chips, the occurrence of a mechanical stress caused by external influences cannot be avoided in the case of this form of mounting. In this case, too, the problem occurs that the plastics compound used is relatively hard and tends to absorb water.

WO 2003/030 247 A2 describes a connection technique wherein chips adhesively bonded onto a rigid substrate are firstly covered with a plastic film. For electrical connection, contact openings are produced in the plastic film. A nucleation layer applied over the whole area in conjunction with a patterned photofilm laminated thereon enables an electrolytic construction of a connecting layer. Finally, the photofilm and uncovered parts of the nucleation layer are removed. In this technique, too, the chips are adhesively bonded onto a rigid substrate, wherein in particular thick, robust ceramic substrates having a high thermal conductivity are provided, which do not prevent a high mechanical stress of the chips.

WO 2005/083 785 A1 describes means which are intended to avoid damage to the connection of a contact pad of a chip with an electrically conductive connecting layer on account of temperature changes. The fitting of a ramp at the critical transition location is proposed for this purpose.

DE 298 23 791 U1 describes a radiation-sensitive converter that is fixed on a flexible support film by means of a layer of a conductive adhesive. Vapor-deposited conductor tracks or bonding wires are provided for an electrical connection.

DE 10 2004 015 597 A1 describes an arrangement of a semiconductor substrate in a housing, wherein the semiconductor substrate is separated from a support substrate of the housing and a protective covering by means of a decoupling device composed of a soft and/or elastic and/or flexible material. A compressible compound, foam and, in particular silicone or polyurethane are specified as materials for the decoupling device. The semiconductor substrate can be arranged using flip-chip mounting and can be connected to a connection device for electrically linking a printed circuit board by means of conductor tracks or redistribution wiring using thin-film technology.

DE 10 2005 050 398 A1 describes a housing with cavity for a mechanically sensitive electronic component and a production method. Materials of the housing parts are ceramics or polymers. The component is held in the cavity in a freely suspended fashion by means of electrically conductive mounts. The mounts can be produced by applying a metallization to a photolithographically patterned resist layer with a subsequent lift-off process or by etching a metallization by means of a photolithographically patterned mask. Instead of this, the mounts can be formed by bonding wires. In order to fix the component during the production of the mounts, a liquefiable compound, in particular a wax, is used.

WO 2006/076 984 A1 specifies, for the purpose of eliminating the adverse effects of temperature changes, conductor tracks in the form of spirals or curved spokes.

WO 2006/084 525 A1 describes means for improving the adhesion of a conductor layer on a dielectric, whereby influences as a result of a change in temperature are intended to be prevented.

WO 2005/050 746 A2 describes a connection technique for optoelectronic components and modules wherein the optoelectronic components are contact-connected in a planar fashion on a substrate. A printed circuit board, in particular a flexible printed circuit board coated with copper on both sides, a ceramic, a stamped or etched leadframe and a layered construction are specified as examples of substrates that can be used. Supports of this type are used in the production of smart cards or flexible circuits. Flexures of flexible printed circuit boards onto which a device housed in this way is soldered are mechanically transmitted to the chip, and so it is necessary to reckon with an increased mechanical stress. In the case of flexural and torsional stress, a thin, flexible support is less favorable than a thicker, rigid substrate.

It is an object of the present invention to specify a system support for stress-sensitive electronic components which keeps the mechanical stress of the component as small as possible and enables the component to be protected. It is a further object to specify an associated production method.

This object is achieved by means of the system support comprising the features of claim 1 and, respectively, by means of methods described herein. Configurations emerge from the dependent claims.

In the case of the system support, a chip provided with an electronic component, or a plurality of chips, is or are mounted on a thin, flexible support, which preferably has a thickness of between 10 μm and 200 μm. Insulating plastic films composed of polyimide or liquid-crystalline polymers (LCP) with or without fiber reinforcement, are particularly suitable as the support. A low mechanical stress of the chip or chips is ensured by means of particular measures for the mechanical decoupling of the chip or chips from the support, which are described further below. The electrical wiring is embodied using a planar connection technique and can be formed by a patterned conductor layer.

The chip can be contact-connected on the top side by means of contact holes being produced in an electrically insulating covering layer present on the chip and connection contact pads of the chip being electrically contact-connected in the contact holes. The covering layer can be produced by applying a film by lamination. Instead, the material of the covering layer can also be applied by casting, spraying or dipping methods. In addition, plated-through holes can be provided in the support, said plated-through holes producing electrically conductive connections between conductor tracks which are present on that side of the support which is provided with the chip, designated as the top side hereinafter, and on that side of the support which faces away from the chip, designated as the underside hereinafter. The underside of the support can be provided, in particular, with one connection contact pad or with two or more connection contact pads for external electrical connection of the chip. The corresponding applies to embodiments comprising a plurality of chips.

Moreover, marginal cutouts can be provided in the support in order to form contact lugs. The cutouts can be e.g. laser-produced incisions or slots in the edge of the support. In this embodiment, the ends of conductor tracks which are provided for the electrical connection of the chip or chips and are arranged on the top side of the support are arranged on the contact lugs and can be configured such that they are widened there. The contact lugs can be provided with plated-through holes for the purpose of underside connection of the ends of the conductor tracks. A higher mechanical compliance is brought about locally as a result of this structure of a flexible circuit support in the region of the external connections and the leads there. In addition, the conductor tracks can be embodied such that they are curved or singly or multiply bent or angled in different forms.

A mechanical decoupling between the chip and the support can be achieved by means of an interlayer arranged between the chip and the support and composed of a very soft, preferably compressible medium. A material provided for this purpose preferably has a modulus of elasticity of less than 1 GPa, preferably less than 50 MPa, and particularly preferably less than 3 MPa. The interlayer can be an air gap, in particular; in embodiments of this type, the component is held above the support by the covering applied on the top side and the conductor tracks on the top side. The following possibilities are likewise advantageous. The interlayer between the chip and the support can be formed by a thick adhesive layer composed of a soft material, such as e.g. silicone rubber, silicone gel, polyurethane or the like. Instead, when mounting the chip onto the support it is possible to arrange an interlayer composed of a compressible foam, a foam adhesive tape or some other soft body. The described means for mechanical decoupling, in particular external contact lugs and an interlayer and/or an air gap, can be used individually or in combination.

It is also suitable for the chip to be mounted on a layer which can be caused to shrink in subsequent process steps, e.g. by heating. In this case, it can be provided that the shrunken layer adheres on the support, but not to the chip underside facing the support. In this way it is possible to produce, in particular, an air gap for complete mechanical decoupling. As an interlayer between the chip and the support it is also possible to use a sacrificial layer which is only used during chip mounting and is removed in later process steps, which can be done e.g. by thermal decomposition or by washing out through an opening provided therefor. The specified means can also be combined with one another. In one advantageous embodiment, a thin sacrificial layer serves as separating material for a further layer, which can be shrunk. As a result, during the shrinkage of the layer it is ensured that the layer on the side of the sacrificial layer, preferably on the side toward the chip, is completely detached and the air gap is formed there.

A further possibility consists in producing a base composed of a fusible material, preferably tin or a tin alloy, on the flexible support, the chip subsequently being mounted on said base. In this case, the base is chosen such that laterally it does not take up the entire mounting area between the chip and the support. The material of the base is heated in a later process step until it becomes liquid, wets the top side—provided with the chip—of the support and spreads over a larger area of the top side of the support. By virtue of this spreading over the larger area, the base loses height, and an air gap is formed between the material of the base that has spread and solidified again and the chip underside. The connection between chip and support is interrupted by the air gap, such that mechanical decoupling is brought about.

The chip or the chips of the system support can comprise, in particular, one or a plurality of inertial sensors (such as, for example, acceleration or gyrosensors) and/or one or a plurality of driving and evaluation circuits.

Examples of the system support will be described in greater detail below with reference to the accompanying figures.

Figure 1:
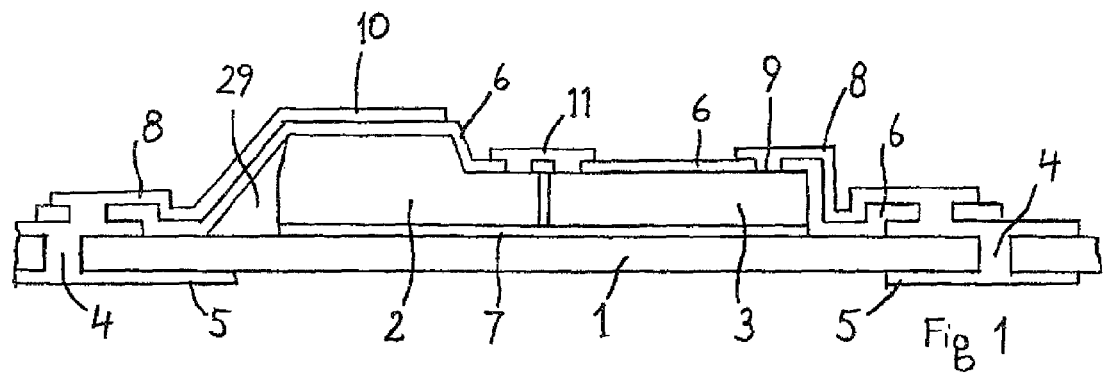
FIG. 1 shows an arrangement of chips on a flexible support in cross section.

FIG. 1 shows an arrangement of chips on a flexible support in cross section. The support 1 is, for example, an electrically insulating plastic film composed of polyimide or liquid-crystalline polymer (LCP) with or without reinforcement by fibers. The thickness of the support 1 is preferably 10 µm to 200 µm. A flexible printed circuit board or some other flexible substrate that is usually used in semiconductor technology is also suitable as a support. Semiconductor chips are arranged on a top side of the support 1; an MEMS component 2 (microelectromechanical system) and an ASIC component 3 (application-specific integrated circuit) are illustrated in the example illustrated in FIG. 1. With regard to an extreme miniaturization striven for and a strict shortening of the electrical connections, the chips can be arranged very closely adjacent to one another on the support. In this case, the distance between the chips is typically of the order of magnitude of double the thickness of a covering layer arranged above the chips, e.g. a film laminate. However, the distance between the chips can also be chosen to be smaller; it is typically in the range of 5 µm to 200 µm. The mounting gap between the chip edges is spanned by the covering, which is applied by lamination, for example. The cross section in FIG. 1 depicts such a covering layer 6 in which cutouts for electrical plated-through holes are present.

In the embodiment of FIG. 1, electrical plated-through holes 4 are also present in the support 1 and connect connection contact pads 5 on the underside to conductor tracks 8 arranged on and above the top side of the support 1. The chips arranged on the support 1 are electrically connected by means of these conductor tracks 8.

The use of a flexible support alone does not prevent mechanical stresses from being transmitted to the chips arranged on the support. Therefore, according to the invention, additional means are provided which solve the problem of mechanically decoupling the chips from the support. For this purpose, by way of example, the base layer 7 depicted in FIG. 1 can be provided, which can be configured in various ways. The base layer 7 can be produced e.g. from a very soft and preferably compressible material. Instead, as base layer 7, it is also possible to provide a thin air layer, that is to say an air gap, between the support 1 and the chips 2, 3. In particular, silicone rubber, silicone gel, polyurethane or the like is suitable as soft material for the base layer 7. A material of this type simultaneously functions as an adhesion layer. Instead, it is also possible to provide a compressible foam or a foam adhesive tape for the base layer 7.

In order to produce an air gap, it is particularly advantageous if, as base layer 7, firstly a layer is applied which can subsequently be caused to shrink, wherein the layer preferably adheres to the support 1, but not to the chips 2, 3. In this way, an air gap for mechanical decoupling can be produced between the shrunken material and the chips 2, 3. In an embodiment of this type, the region of the base layer 7 depicted in FIG. 1 is taken up partly by the air gap and partly by the remaining portion of the shrunken layer. Instead of a layer to be shrunk, it is also possible to provide a sacrificial layer, which is completely removed in a subsequent process step which can be done by thermal decomposition or by washing out through an opening in the support or laterally with respect to the chips. Water-soluble polymers such as, for example, polyvinyl alcohol, cellulose derivatives or polyvinyl pyrrolidone are advantageous for this purpose. The various possibilities mentioned can also be combined with one another. In one advantageous embodiment, a thin sacrificial layer serves as separating material between the chips and a further layer, which is shrunk. The removal of the sacrificial layer ensures that the shrunken layer detaches completely from the chips. A further possibility will be described further below with reference to FIGS. 4 and 5.

The cross section in FIG. 1 additionally reveals how electrical connections on the top side can be applied on the chips. For this purpose, suitable cutouts are provided in the covering layer 6, in which cutouts connection contacts 9 are formed between the conductor tracks 8 and connection locations of the chips. In this way, it is also possible to provide an electrically conductive chip-to-chip connection 11 between connections of the chips 2, 3 mounted on the support 1. A shield 10 can be present on the top side for the MEMS component 2, said shield being formed by a planar metallization connected to a conductor track 8.

In order to avoid surface creepage currents and corrosion particularly in the case of condensing moisture, a sealing of the contact locations is advantageous. For this purpose, the chip connection metallization uncovered in the contact windows of the covering layer 6 can be covered with the conductive layer completely and in a manner overlapping toward the outside in order to prevent contact corrosion at transitions between different metals. In addition, the conductor tracks 8 can also be covered at least locally in the region of electrical connections with an insulation layer, such as a film laminate, for example. That is important particularly in the case of an arrangement in cavity housings if the latter do not permanently ensure an interior atmosphere that is free of water vapor.

A pronounced surface unevenness caused by the topology of the chips makes it considerably more difficult to apply a covering film by lamination. Moreover, very steep, perpendicular or even overhanging side walls impair the resolution of a photolithography since, at the relevant locations, effectively a much thicker photoresist layer has to be exposed than in regions in which the surface runs substantially horizontally. The same is correspondingly applicable to laser ablation of the covering for direct patterning. It is therefore advantageous if the height profile is flattened using suitable means. Possibilities for this purpose include, for example, the use of shaped parts (e.g. injection-molded plastic frames or plastic wedges having an inclined outer edge which are arranged around or at a chip), underfillers, a distinct chip adhesive bead, an edge bevel applied by dispenser or inkjet and composed of initially viscous, then curing material, or a ramp produced by stereolithographic methods. Such a ramp 29 is illustrated in cross section in FIG. 1 and makes it possible to produce a less steep connection between the conductor track 8 running on the support 1 and the shield 10 on the top side of the MEMS component 2.

Figure 2:
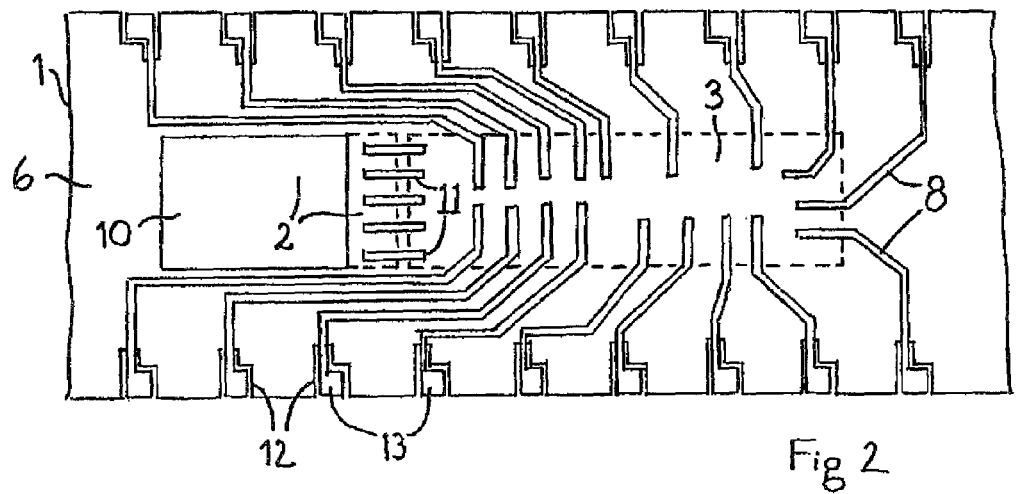
FIG. 2 shows an arrangement of chips on a flexible support in a plan view.

FIG. 2 shows a further possibility as to how the chips 2, 3 mounted on the support 1 can be mechanically decoupled from the support. In this configuration, external electrical connections are situated at contact lugs 13 in marginal cutouts 12 in the support 1. In addition, a base layer in accordance with the above-described embodiment of FIG. 1 can be present between the chips 2, 3 and the support 1. FIG. 2 shows, in the plan view of the support 1, the regions occupied by the covering layer 6 and also the conductor tracks 8 arranged thereon. In this example, too, an MEMS component 2 and an ASIC component 3 arranged alongside the latter are present, the contours of which are concealed by the covering layer 6 and the conductor tracks 8 and also the shield 10 and the chip-to-chip connections 11 and are therefore depicted by dashed lines.

The conductor tracks 8 are led to contact lugs 13 at the edges of the support 1 and are preferably, but not necessarily, widened there. The contact lugs are arranged in marginal cutouts 12 in the support 1 and can be formed by slots or incisions present on both sides of the respective contact lug in the edge of the support, such that the contact lugs are formed by the material of the support. Plated-through holes—not discernible in the plan view in accordance with FIG. 2—in the contact lugs 13 below the widened ends of the conductor tracks 8 can be provided in order to connect the conductor tracks 8 to soldering connection pads on the underside of the contact lugs 13, analogously to the plated-through holes in the embodiment of FIG. 1. The cutouts 12 bring about greater mechanical compliance locally since the marginal connection contact pads of the conductor tracks 8 are not rigidly connected to the main part of the support 1. Changes in the positions of the external connections are therefore transmitted at most to the contact lugs, but moreover not directly to the support 1, with the result that a lower mechanical stress of the conductor tracks 8 and hence also of the chips mounted onto the support 1 is achieved. An additional improvement is achieved if the conductor tracks 8 are embodied such that they are curved or bent in various ways, single or else multiple changes of direction being possible. In this way, the configuration of the conductor tracks can also be adapted well to the different positions of the connection contacts of the chips. The connection contacts of the chips are thus largely mechanically decoupled from the external connections formed at the contact lugs 13, such that at most a low mechanical stress is transmitted to the chips if the contact lugs are deformed relative to one another or to the support. The number of conductor tracks 8 and chip-to-chip connections 11 in the same way as the number and configuration of the components in FIG. 2 are specified only as an example and can be varied in accordance with the respective requirements. Thus, one or a plurality of chips, further active and/or passive components or else components integrated into the support can be present in all of the embodiments.

The connection contacts 9 uncovered in the contact windows of the covering layer 6, in particular of a film laminate, in accordance with FIG. 1, which connection contacts can be e.g. connection metallization of the chips, are preferably completely covered with the conductor tracks 8 in order to prevent contact corrosion at transitions between different metals. The chip-to-chip connections 11 can preferably be covered with an insulation layer, such as e.g. a film laminate, on the top side at least in regions. That is advantageous particularly when the support 1 is not hermetically encapsulated with the remaining components.

Figure 3:
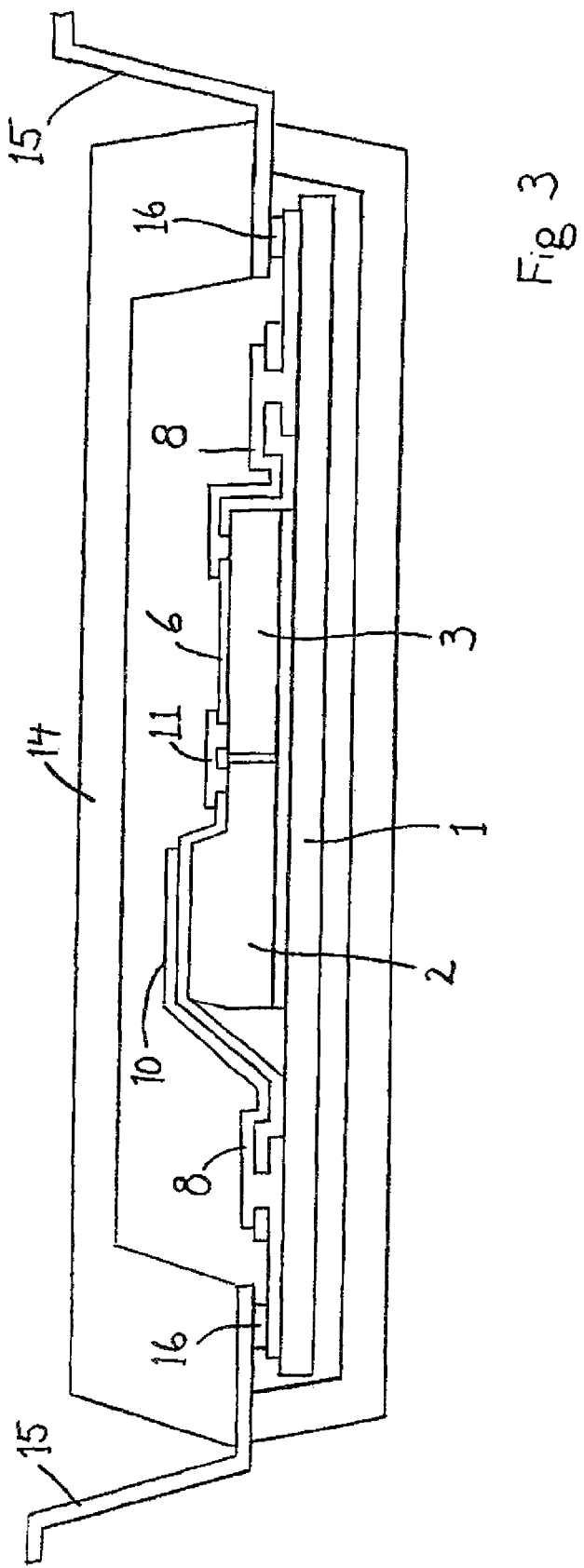
FIG. 3 shows an arrangement of a support provided with chips in the cavity of a housing.

FIG. 3 shows, in a cross section in accordance with FIG. 1, an arrangement wherein the support 1 with the chips 2, 3 applied thereon is mounted in a cavity housing. The housing 14 is provided with electrical conductors 15 for external electrical connection. It can be composed of two parts, for example, between which the conductors 15 are led from the interior toward the outside. Electrically conductive connections 16 between the conductors 15 of the housing 14 and connection pads of the conductor tracks 8 of the support 1 are present. The remaining components in the cross section in FIG. 3 correspond to the components in the arrangement in accordance with the cross section in FIG. 1 and are provided with the same reference symbols.

Figure 4:
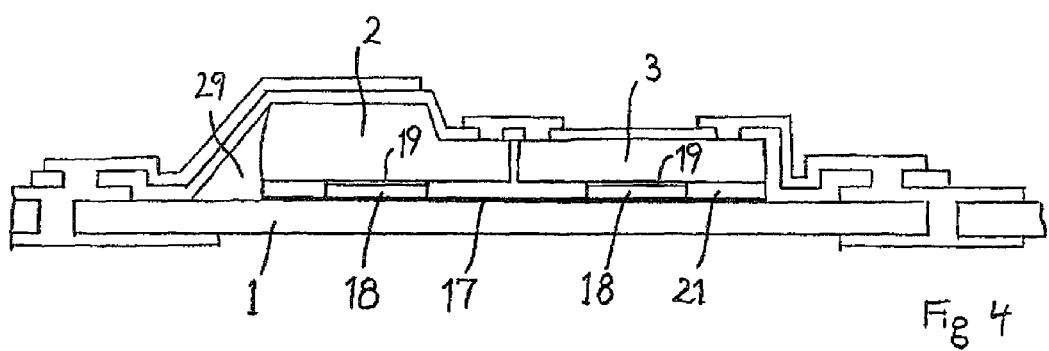
FIG. 4 shows a cross section in accordance with FIG. 1 with chips mounted onto bases.

A further embodiment for the production of a whole-area air gap between the chips and the support is described below with reference to FIGS. 4 and 5. In this case, in accordance with the cross section in FIG. 4, a chip 2, 3 is mounted in each case by one or a plurality of partial areas for its underside on a base composed of a fusible material. Said base is preferably a metal base 18, e.g. composed of tin or a tin alloy, which can be provided with a thin adhesive layer 19 on the top side and can be arranged on a metallization 17 of the support 1, which metallization at least substantially covers that region of the top side of the support 1 which is to be occupied by the chips. The metal base 18 is heated and thereby liquefied, and the liquid metal spreads over a larger area, the metallization 17 facilitating wetting of the area. The metal that has spread has a smaller height than the metal base, as a result of which a gap is formed between the chips and the support.

Figure 5:
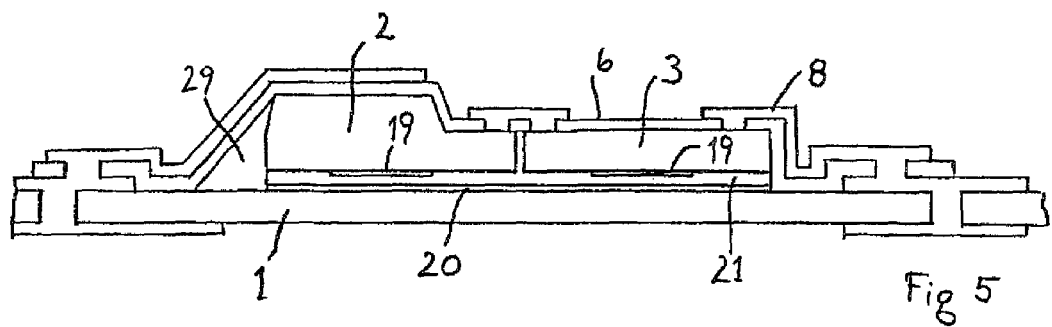
FIG. 5 shows a cross section in accordance with FIG. 4 after the heating and flowing of the material of the bases.

FIG. 5 shows the arrangement after the flowing of the material of the metal base 18 and subsequent solidification of the material to form a metal layer 20. The air gap 21 between the chips 2, 3 and the support 1 is now present over the whole area below the chips 2, 3 and brings about a decoupling of the chips 2, 3 from the support 1. In this arrangement, the chips 2, 3 are held by the covering layer 6 and the conductors tracks 8 above the air gap 21. The metal base 18 can be e.g. a tin base deposited electrolytically in patterned fashion, and the metallization 17 can be provided for being wetted by the molten tin, such that the tin spreads uniformly to form the metal layer 20. In this embodiment, it may be useful to provide a certain permeability in the region of the air gap 21 to be produced, e.g. a small hole in the support 1 or in the covering layer 6 on the top side, in order to avoid minimal deformations owing to changing external conditions, such as e.g. the surrounding air pressure or the temperature. The air gap 21 should not be hermetically sealed toward the outside for this purpose.

Figure 6:
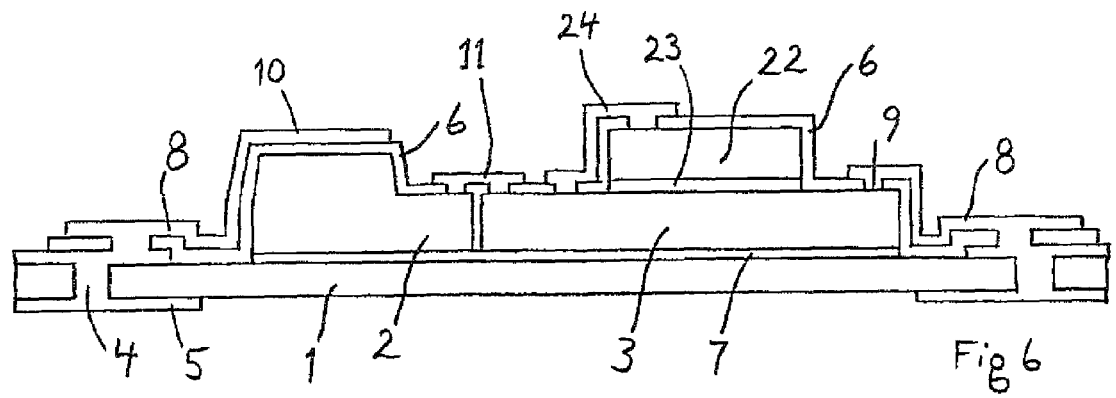
FIG. 6 shows a cross section in accordance with FIG. 1 for a stacked arrangement of chips on a flexible support.

One development of the arrangement provides for stacking chips one above another on the support 1, as is illustrated in cross section in an example in FIG. 6. Contact pads on the chip 3 arranged at the bottom remain free laterally, such that the lower chip can be electrically connected. The example in FIG. 6 illustrates on the support 1 above a base layer 7 on the left-hand side an MEMS component 2 and on the right-hand side an ASIC component 3 and also a memory component 22 arranged on the ASIC component 3. An interlayer 23, which can be formed e.g. from the same material as the base layer 7, is situated between the ASIC component 3 and the memory component 22. An arrangement of this type, which can have, in principle, any desired components in different planes, makes it possible to arrange a plurality of chips on the support in a space-saving manner. The electrical connections between the components can also be embodied in a space-saving manner by means of direct connections in two or more planes without a detour via conductor tracks that run directly on the support. The arrangement of the conductor tracks 8, of the chip-to-chip connections 11 and, if appropriate, of further chip-to-chip connections 24, such as between the ASIC component 3 and the memory component 22 in the example in FIG. 6, makes it possible to produce electrical connections between a plurality of planes simultaneously in one production step.

Figure 7:
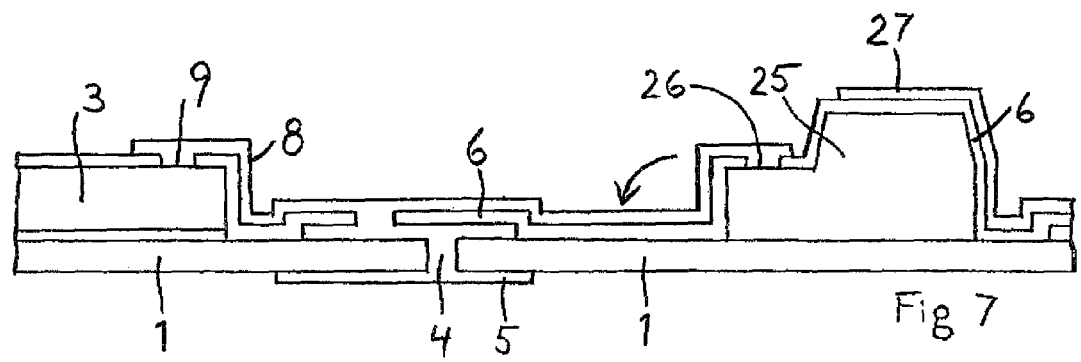
FIG. 7 shows a further arrangement in a cross section in accordance with FIG. 1.
Figure 8:
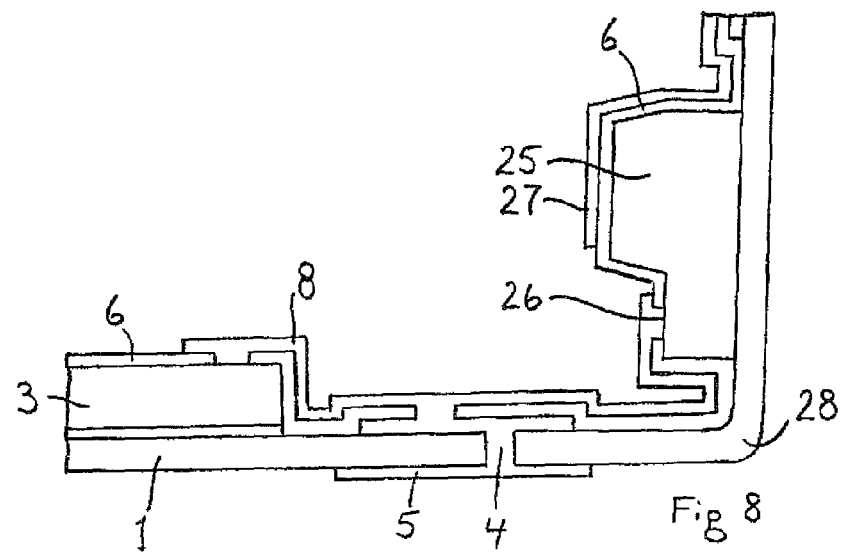
FIG. 8 shows the arrangement in accordance with FIG. 7 after bending of the flexible support.

FIGS. 7 and 8 show cross sections through a further embodiment, which is provided for a spatially adapted mounting of the system support. This is advantageous particularly if the system support is provided for inertial sensors. Sensors of this type serve for measuring translational and/or rotational accelerations by measuring the movement of a resiliently suspended inertial mass relative to the substrate of the sensor. The customary construction of sensors of this type often does not allow the desired spatial detection axis actually to be realized within the chip in such a way that the chip can be mounted in a usual manner with its front side or rear side on a system support. Instead it may be necessary to orient the chip perpendicularly to the surface of the system support or at a different angle with respect thereto, which is generally not possible in the case of conventional housing techniques.

The embodiment illustrated in cross section in FIG. 7 affords the possibility of bending one portion of the support, such that the chips mounted on this portion are brought to a different position, while the rest of the support maintains its original position. FIG. 7 shows an excerpt from the support 1 which corresponds to the right-hand part of the cross section in FIG. 1 and furthermore shows a further MEMS component 25 as an example of an further mounted chip. There are situated on the further MEMS component 25 a further connection contact 26 and a further shield 27, which, in this example, are embodied in a manner comparable to the components illustrated in FIG. 1, but can also be modified. A portion of the support 1 on which no chip is arranged is situated between the ASIC component 3 and the further MEMS component 25. Only the thin covering layer 6 and, if appropriate, conductor tracks 8 are situated in this region. Therefore, the support 1 can be bent in this region in accordance with the arrow depicted in FIG. 7. The embodiment illustrated in FIG. 8 is thus obtained, in which embodiment the support 1 has a bending location 28. The further MEMS component 25 is thus arranged perpendicularly relative to the rest of the support 1, having the ASIC component 3 and, if appropriate, further components, such that, for example, the orientation of a sensor axis of the further MEMS component 25 is changed relative to the orientation of the remaining portion of the support 1. This arrangement can be produced in a simple manner by means of the same process steps with which the embodiments described above are also produced. The differing orientation of the different chips is made possible by simple bending of the support. In order to ensure particularly precise compliance with the angle during the bending process, it may be advantageous to orient the bent portion of the support at a reference area and to fix it there. An MID shaped part (molded interconnect device), a three-dimensional circuit support which, by way of example, is produced in an injection-molding method and is partly metalized, if appropriate, is particularly suitable for this purpose. However, walls or webs of, in principle, any desired housing parts are also suitable for orienting the bent portion of the support, wherein it is also possible to provide particular measures at the housing such as, for example, stops, latching arrangements or fixing elements which define an exact angle for the bent part of the support. In this way, it is also possible to bend a plurality of circuit parts out of the plane at different angles, in particular in such a way that ultimately three mutually perpendicular partial areas are obtained.

The support 1 can be provided with a cap for covering at least one chip. In this case, not all of the chips have to be covered by the cap. The cap can consist of plastic, metal, glass or ceramic and can be fixed by adhesive bonding, welding or soldering. If the support has cutouts 12 as in the embodiment in FIG. 2, it may be advantageous if the cutouts are arranged outside the contour of the cap, that is to say are not covered by the cap.

LIST OF REFERENCE SYMBOLS

1 Support
2 MEMS component
3 ASIC component
4 Plated-through hole
5 Connection contact pad
6 Covering layer
7 Base layer
8 Conductor track
9 Connection contact
10 Shield
11 Chip-to-chip connection
12 Cutout
13 Contact lug
14 Housing
15 Conductor
16 Connection
17 Metallization
18 Metal base
19 Adhesive layer
20 Metal layer
21 Air gap
22 Memory component
23 Interlayer
24 Further chip-to-chip connection
25 Further MEMS component
26 Further connection contact
27 Further shield
28 Bending location
29 Ramp

The invention claimed is:

1. A system support for an electronic component, comprising:
a flexible support having a top side, the flexible support being an insulating plastic film having a thickness between 10 μm, and 200 μm,
at least one chip having a microelectromechanical component, wherein the chip is mounted above the top side of the support,
at least one means for mechanically decoupling the chip from the support,
wherein electrical connections of the chip are embodied using a planar connection technique,
conductor tracks for electrically connecting the component arranged on the top side of the support,
wherein the conductor tracks are led to connection contacts on a top side of the chip, facing away from the support,
contact pads arranged on the underside of the support, and
plated-through holes in the support, the plated-through holes connecting the contact pads to the conductor tracks,
wherein an air gap or a base layer composed of a material that brings about a mechanical decoupling of the chip from the support is provided between the chip and the top side of the support, and
wherein the support has an edge provided with cutouts or notches forming flexible lugs in the material of the support, ends of the conductor tracks being arranged on the flexible lugs.

2. The system support as claimed in claim 1, wherein a base layer composed of a material having a modulus of elasticity of less than 1 GPa, or less than 50 Mpa, or less than 3 Mpa is present between the chip and the top side of the support.

3. The system support as claimed in claim 1, wherein a base layer composed of a compressible foam, or a foam adhesive tape, or silicone rubber, or silicone gel, or polyurethane is present between the chip and the top side of the support.

4. The system support as claimed in claim 1, wherein the support has an edge in which notches are provided, the conductor tracks comprise widened ends arranged in the notches, the widened ends forming contact tabs, and plated-through holes are arranged in the cutouts below the widened ends of the conductor tracks.

5. The system support as claimed in claim 1, wherein
at least two chips are arranged above the top side of the support at a distance of 5 μm to 200 μm, such that a gap is present between the at least two chips, the gap is covered with a covering layer formed by a film laminate, and
chip-to-chip connections are provided on top sides of the chips, facing away from the support, said chip-to-chip connections effecting an electrically conductive connection between connection contacts of the chips, and the chip-to-chip connections are embodied using a planar connection technique.

6. The system support as claimed in claim 5, wherein the chips comprise a height profile, at least one ramp is arranged at a sidewall of a chip to flatten the height profile, and the covering layer is applied on the ramp.

7. The system support as claimed in claim 1, wherein a shield is present, which is formed by a conductor area arranged on the chip, and the conductor area is provided for connection to a ground potential.

8. The system support as claimed in claim 1, wherein the electrical connections of the chip respectively completely overlap connection metallizations of the chip.

9. The system support as claimed in claim 1, wherein at least two chips are mounted one above another above the top side of the support, and electrical connections of the chips are embodied using a planar connection technique.

10. The system support as claimed in claim 1, wherein the support has at least two portions arranged at an angle with respect to one another at a bending location of the support.

11. The system support as claimed in claim 10, wherein a housing is provided, having means for orienting and fixing one portion of the support at a predefined angle with respect to another portion of the support.

12. The system support as claimed in claim 11, wherein the angle is 90°.

13. The system support as claimed in claim 1, wherein the insulating plastic film is a polyimide or a liquid-crystalline polymer (LCP).

14. The system support as claimed in claim 1, further comprising an air gap between the chip and the top side of the support.

15. A system support for an electronic component, comprising:
    a flexible support having a top side, the flexible support being an insulating plastic film having a thickness between 10 μm and 200 μm,
    at least one chip having a microelectromechanical component, wherein the chip is mounted above the top side of the support,
    at least one means for mechanically decoupling the chip from the support,
    wherein electrical connections of the chip are embodied using a planar connection technique,
    conductor tracks for electrically connecting the component arranged on the top side of the support,
    wherein the conductor tracks are led to connection contacts on a top side of the chip, facing away from the support,
    contact pads arranged on the underside of the support, and
    plated-through holes in the support, the plated-through holes connecting the contact pads to the conductor tracks,
    wherein an air gap or a base layer composed of a material that brings about a mechanical decoupling of the chip from the support is provided between the chip and the top side of the support,
    wherein the support has an edge in which cutouts or notches are provided, so that flexible lugs are formed in the material of the support, and wherein the conductor tracks comprise ends arranged on the flexible lugs, thus forming the contact tabs, and plated-through holes are arranged in the notches below the ends of the conductor tracks.

16. A system support for an electronic component, comprising:
    a flexible support having a top side, the flexible support being an insulating plastic film having a thickness between 10 μm and 200 μm,
    at least one chip having a microelectromechanical component, wherein the chip is mounted above the top side of the support, the support extending beyond the outline of the at least one chip,
    at least one means for mechanically decoupling the chip from the support,
    wherein electrical connections of the chip are embodied using a planar connection technique,
    conductor tracks for electrically connecting the component arranged on the top side of the support,
    the support having an edge structured with notches or incisions to form flexible lugs in the material of the support,
    wherein the conductor tracks lead away from the component so that end portions of the conductor tracks are arranged at the flexible lugs,
    contact pads arranged on the underside of the support, and
    plated-through holes in the support, the plated-through holes connecting the contact pads to the conductor tracks,
    wherein an air gap or a base layer composed of a material that brings about a mechanical decoupling of the chip from the support is provided between the chip and the top side of the support.

17. A system support for an electronic component, comprising:
    a flexible support having a top side and an edge, the flexible support being an insulating plastic film;
    at least one chip having a microelectromechanical component, the chip being mounted above the top side of the support;
    conductor tracks formed in a planar connection technique above the top side of the support;
    connection contacts on a top side of the chip facing away from the support, the connection contacts being formed between the conductor tracks and connection locations of the chip;
    cutouts or notches in the edge of the support, the cutouts or notches forming flexible lugs in the material of the support;
    ends of the conductor tracks being arranged on the flexible lugs, thus forming contact lugs; and
    connection contact pads being provided at the contact lugs for external connections.

18. The system support according to claim 17, further comprising:
    connection pads under the contact lugs; and
    plated-through holes in the contact lugs, the plated-through holes connecting the conductor tracks to the connection pads.

19. The system support according to claim 17, further comprising:
    an air gap or a base layer composed of a material that brings about a mechanical decoupling of the chip from the support, the air gap or base layer being provided between the chip and the top side of the support.

20. The system support according to claim 17, wherein the insulating plastic film has a thickness between 10 pm and 200 pm.

21. The system support according to claim 17, wherein the ends of the conductor tracks arranged on the lugs or tabs include widened ends of the conductor tracks arranged on the lugs or tabs.

* * * * *